United States Patent [19]
Eddings et al.

[11] Patent Number: 6,157,540
[45] Date of Patent: Dec. 5, 2000

[54] SCREWLESS FRONT LOADING HARD DRIVE BRACKET

[75] Inventors: Richard Eddings, Austin; Gilberto Hernandez, Round Rock, both of Tex.

[73] Assignee: Dell USA, L.P., Round Rock, Tex.

[21] Appl. No.: 09/123,130

[22] Filed: Jul. 27, 1998

[51] Int. Cl.$^7$ .............................. H05K 5/00; H05K 7/16; A47B 81/00; A47B 96/06; G06F 1/16
[52] U.S. Cl. .......................... 361/727; 361/724; 361/741; 361/752; 361/610; 361/616; 312/223.2; 29/521
[58] Field of Search ...................................... 361/685, 683, 361/724, 727, 610, 616, 747, 752; 312/223.2; 248/220.21, 220.22; 364/708.1

[56] References Cited

U.S. PATENT DOCUMENTS

| | | | |
|---|---|---|---|
| 5,067,041 | 11/1991 | Cooke et al. | 361/394 |
| 5,192,222 | 3/1993 | Krause et al. | |
| 5,333,097 | 7/1994 | Christensen et al. | |
| 5,379,184 | 1/1995 | Barraza et al. | 361/685 |
| 5,398,161 | 3/1995 | Roy | 361/727 |
| 5,471,099 | 11/1995 | Larabell et al. | |
| 5,515,515 | 5/1996 | Kennedy et al. | |
| 5,557,499 | 9/1996 | Reiter et al. | |
| 5,604,662 | 2/1997 | Anderson et al. | |
| 5,680,293 | 10/1997 | McAnally et al. | 361/685 |
| 6,064,568 | 5/2000 | Schmitt | 361/685 |

*Primary Examiner*—Lynn D. Feild
*Assistant Examiner*—Tung Minh Bui
*Attorney, Agent, or Firm*—Haynes and Boone, LLP

[57] ABSTRACT

A bracket support includes a chassis and a bracket movably mounted in the chassis. A locking tab is mounted on the bracket and is movable between an engaged position with the chassis and a released position with the chassis. A door is mounted on a surface of the chassis and is movable between an open position and a closed position. The door includes a tab securing slot. An arm extends from the door. The door urges the locking tab to the engaged position when the door is in the closed position. The arm moves the locking tab to the released position and partially extracts the bracket from the chassis when the door is moved to the open position. The tab securing slot secures the locking tab into the engaged position when the door is in the closed position.

21 Claims, 7 Drawing Sheets

SCREWLESS FRONT LOADING HARD DRIVE BRACKET

BACKGROUND

The disclosure herein relates generally to computer systems and more particularly to a front loading hard drive bracket for a mini-tower.

Computer chassis, including mini-towers, have several components mounted inside the chassis walls. Some of the components are very heavy and occupy a great deal of space within the chassis. Mounting the larger components is challenging because consideration must be given to mounting during manufacturing and possible subsequent removal and replacement during required service to the computer.

Taking the size and weight factors into consideration for purposes of manufacture and repair, some of the heavy components have been mounted on rotating or pivoting support members or brackets which may be rotated into and out of the chassis and secured into position within the chassis by a screw fastener.

A problem associated with pivoting and rotating parts into and out of their mounting position in a computer chassis, is related to space. Because a rotating component requires an arcuate path to permit the component and its associated support bracket to pivot into and out of position, additional space is required in the chassis to provide for the arcuate path. The additional space is therefore unavailable for other components to be mounted in the chassis.

Recent trends in computer building have moved in the direction of screwless mounting and installation procedures. Many components are being installed by snap-in, slide-in, push-button release devices. These devices reduce manufacture time and also make repair and replacement less time consuming. Screwless construction does require, however, that the components must be capable of being retained securely in their installed position so that the equipment can pass required impact testing. As a result, locking tabs and snap devices are used to secure components and replace screw-type mountings used in the past.

Another factor in mounting components in computer chassis is access. There are several external surfaces on a computer chassis. Some surfaces are used as support surfaces, some surfaces are used for external connectors, others are used for access by installation and/or repair personnel, and still others must be accessible by users for installing CD roms, floppy disks, PCMCIA cards, and the like.

Therefore, what is needed is a method and apparatus which permits installation and removal of a hard drive bracket from a computer chassis which eliminates the need for using screws to mount or secure the bracket in a stored position in the chassis, which allows the user to install the bracket without tools, and which permits easy user access.

SUMMARY

One embodiment, accordingly, provides a hard drive bracket which slides into and out of a front wall of the chassis, and which snaps into and out of position within the chassis. Also, when the bracket is fully seated in the chassis, a snap-lock feature secures the bracket and hard drives in the chassis. To this end, a bracket support includes a chassis and a bracket movably mounted in the chassis. A first means is mounted on the bracket for movement between an engaged position with the chassis and a released position with the chassis. A door is mounted on a surface of the chassis. The door is movable between an open position and a closed position. The door also includes a tab securing slot formed therein. The door urges the first means to the engaged position when the door is in the closed position. A second means extends from the door and is movable with the door to move the first means to the released position when the door is moved toward the open position.

A principal advantage of this embodiment is that the bracket and the hard drives are accessible at the front panel of the mini-tower chassis. The bracket is removable by a door device that secures the bracket in position within the chassis and that partially ejects the bracket for removal from the chassis.

DETAILED DESCRIPTION OF THE PREFERRED EMBODIMENT

Figure 1:
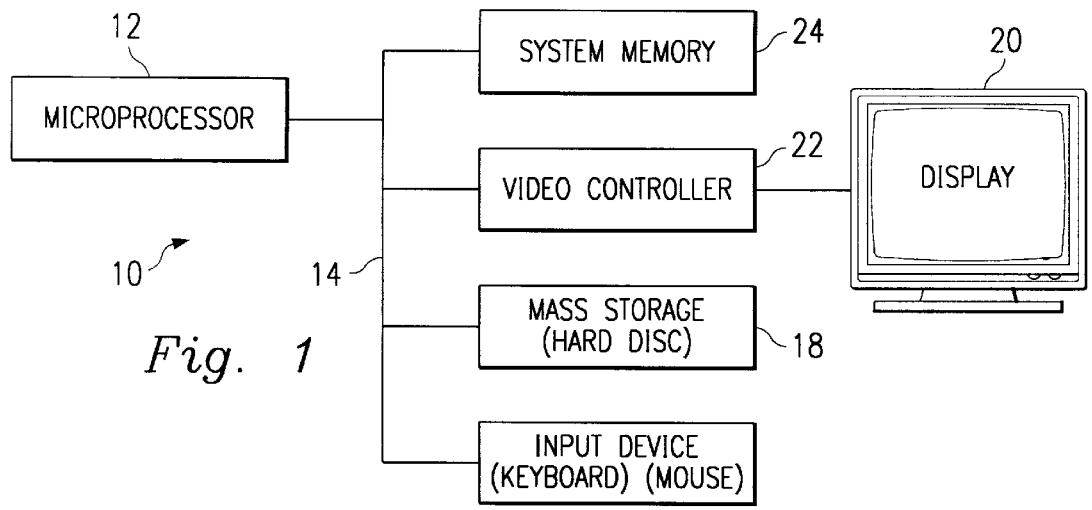
FIG. 1 is a diagrammatic view illustrating an embodiment of a typical computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
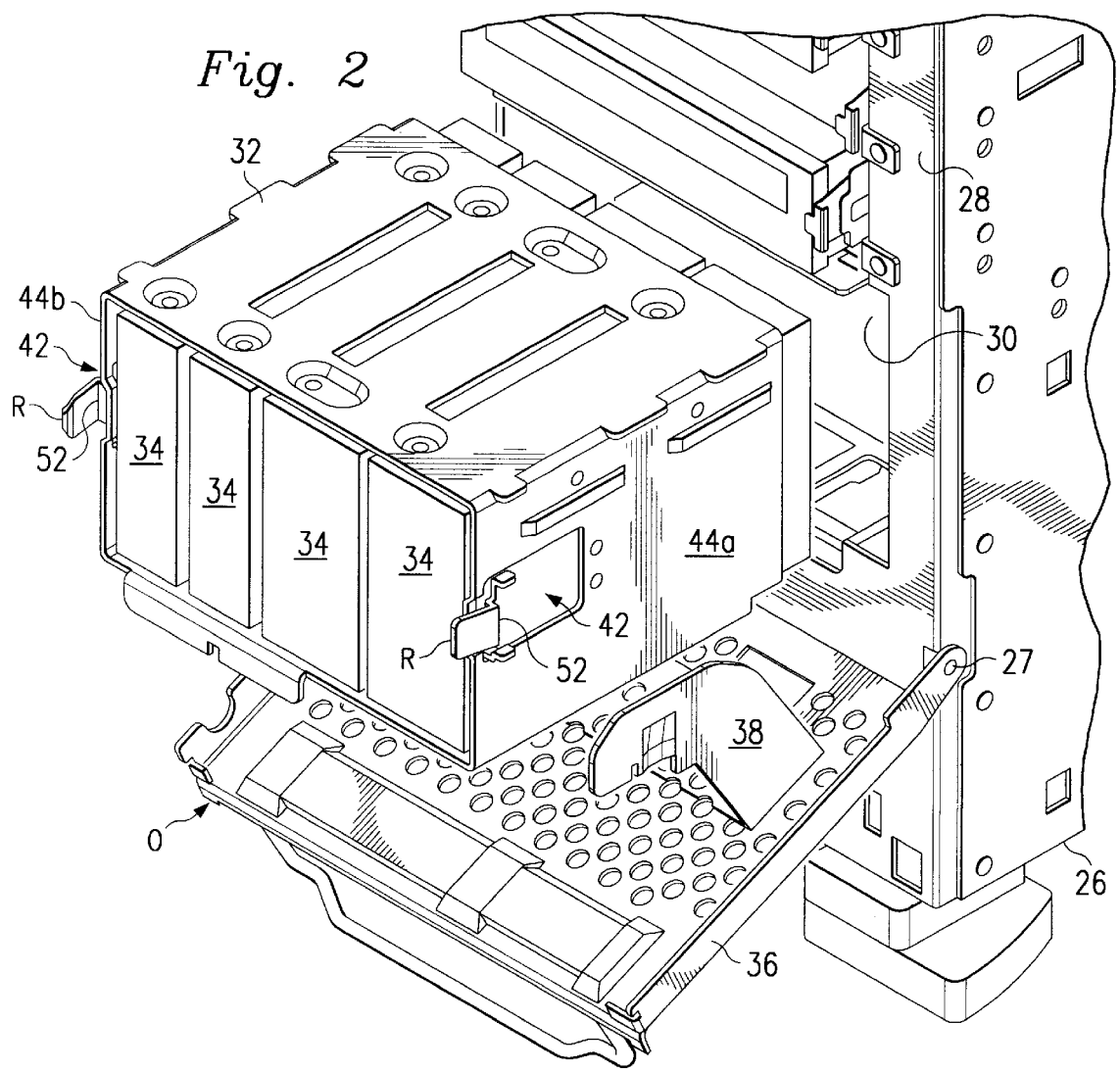
FIG. 2 is a partial isometric view illustrating an embodiment of a hard drive bracket and a computer chassis.
Figure 3:
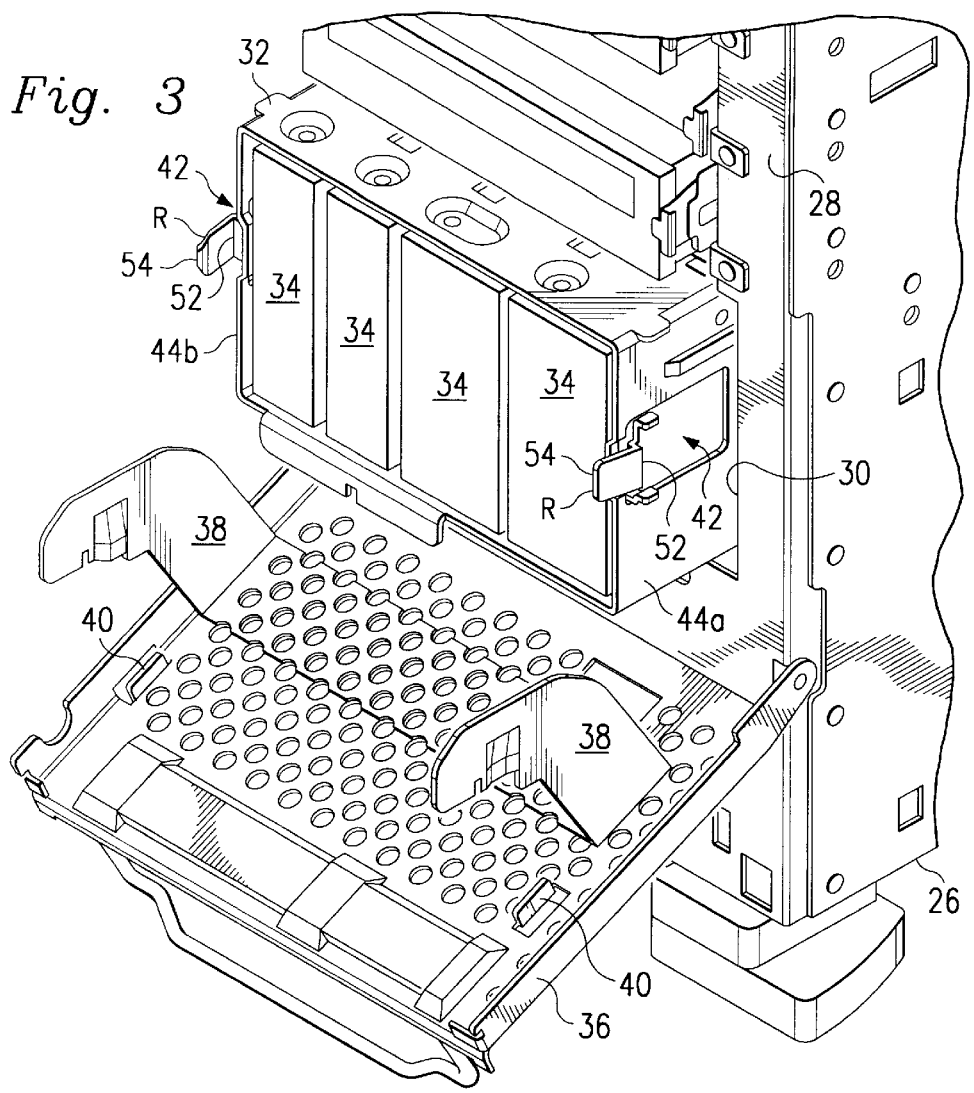
FIG. 3 is a partial isometric view illustrating an embodiment of a hard drive bracket partially installed in a computer chassis.

A computer in the form of a mini-tower chassis, is partially shown and designated 26 in FIG. 2 and is part of the system 10, FIG. 1. Chassis 26 has a front surface 28 including a bay 30 for installing a hard drive bracket 32 carrying a plurality of hard drives 34. A door 36 is pivotally mounted at a pivot point 27, on front surface 28 of chassis 26, and is illustrated in an open position, designated "O". In FIG. 3, bracket 32 is partially installed in bay 30. Door 36 includes at least one arm 38 extending therefrom for movement therewith, and preferably includes a pair of arms 38. Door 36 also includes at least one tab securing slot 40 formed therein, and preferably includes a pair of slots 40.

Figure 4:
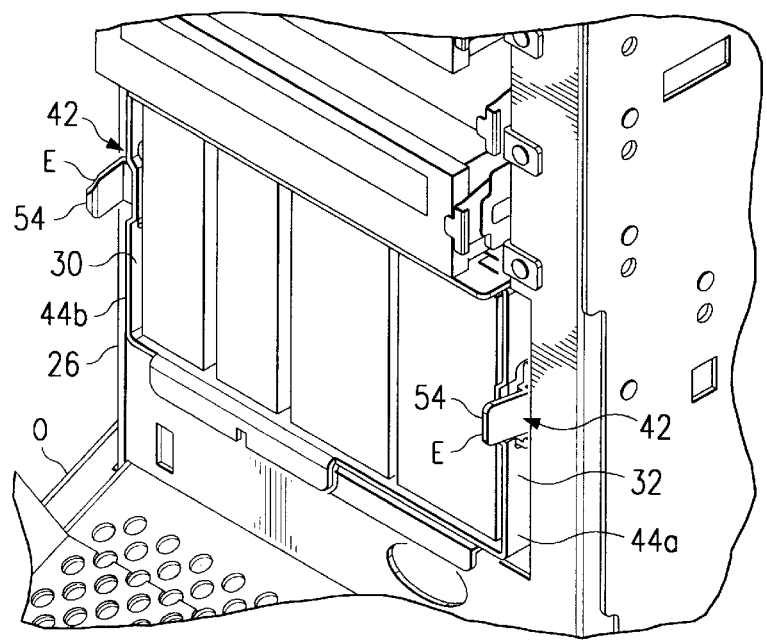
FIG. 4 is another partial isometric view illustrating an embodiment of a hard drive bracket installed in a computer chassis.
Figure 5:
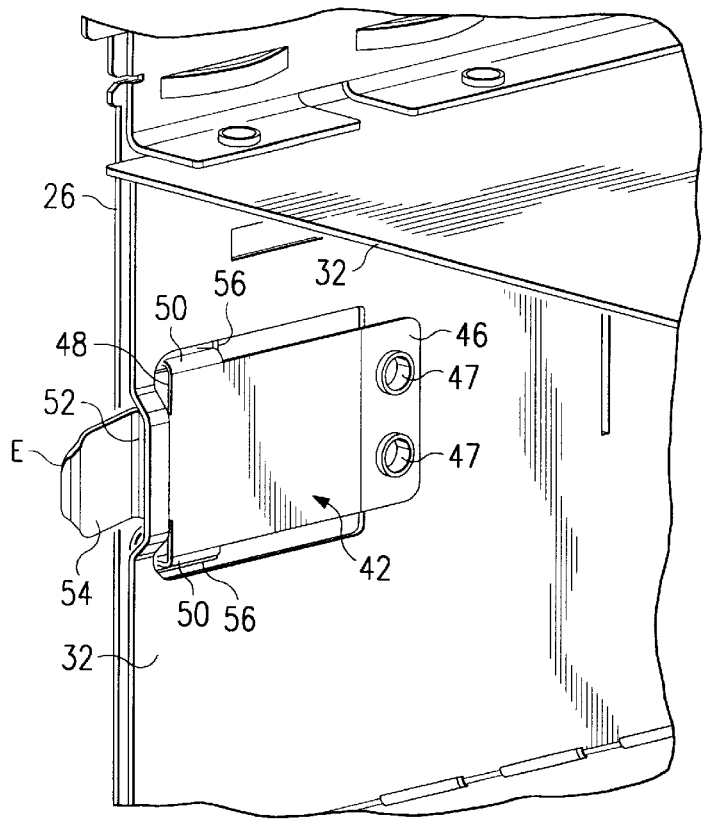
FIG. 5 is a partial isometric view illustrating an embodiment of a locking tab on a hard drive bracket in a computer chassis.

As is revealed in FIGS. 2, 3 and 4, bracket 32 is movably mounted in chassis 36 and is installed by sliding bracket 32 into bay 30. At least one locking tab 42, and preferably a pair of locking tabs 42, extend from opposite sides 44a and 44b of bracket 32. Tabs 42, FIG. 5, are resiliently connected to bracket 32 in a cantilever manner having a first end 46 attached to bracket 32, for example by fasteners 47, and a second free end 48 movable relative to bracket 32. A pair of tabs 50, FIGS. 5 and 6, extend perpendicularly from each tab 42. Also a shoulder 52 extends perpendicularly from each tab 42 and a flared lip portion 54 forms an axial extension of each tab 42. In FIGS. 2 and 3, tabs 42 are shown in a released position, designated R, relative to chassis 26. In FIG. 4, bracket 32 is fully seated in chassis 26 and tabs 42 are in an engaged position, designated E, FIGS. 5 and 6, with chassis 26, due to the engagement of tabs 50 with a pair of co-located apertures 56 formed in chassis 26.

Figure 6:
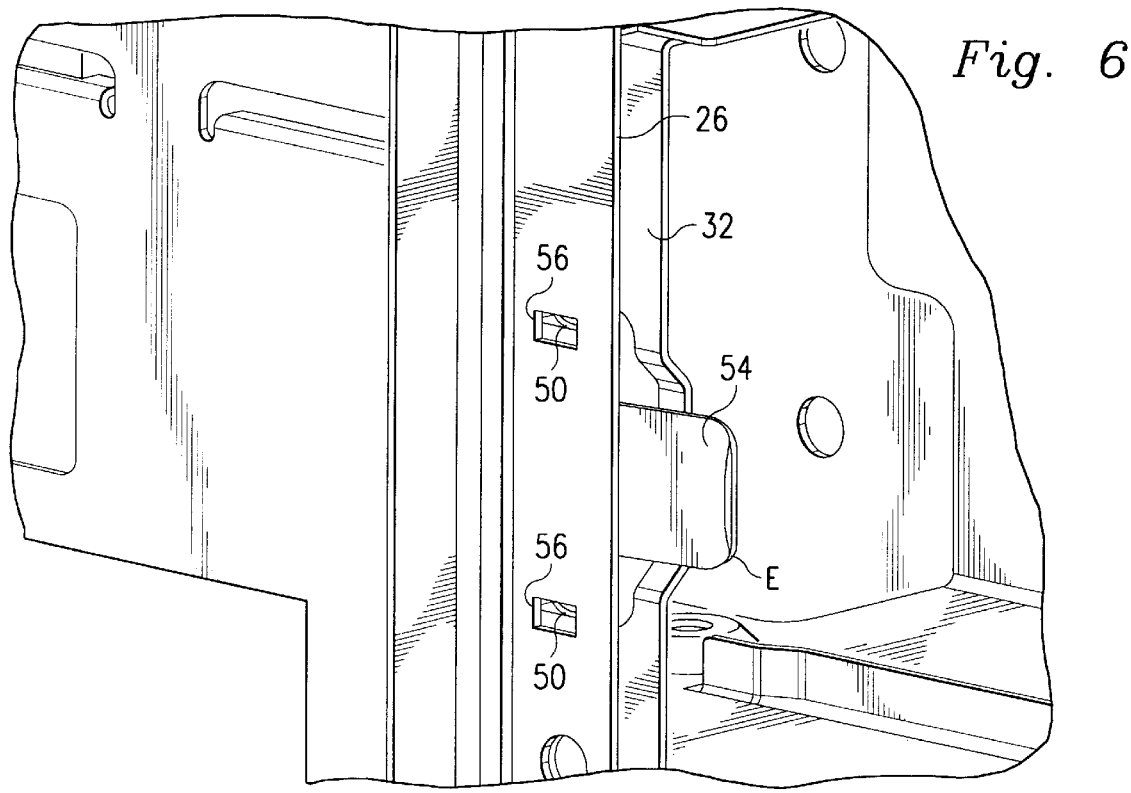
FIG. 6 is another partial isometric view illustrating an embodiment of a locking tab on a hard drive bracket in a computer chassis.
Figure 7:
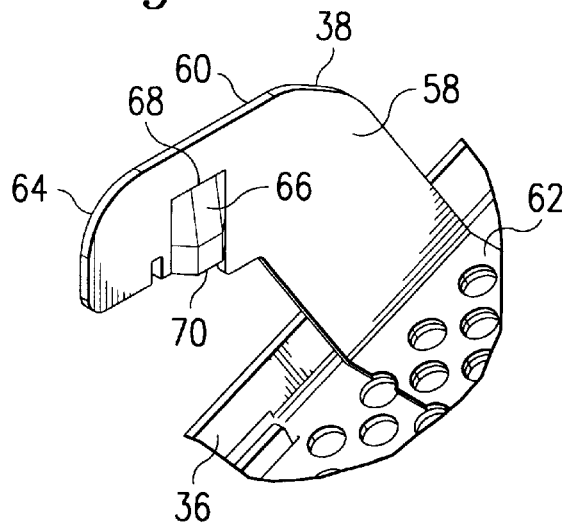
FIG. 7 is a partial isometric view illustrating an embodiment of an arm mounted on a computer chassis door.
Figure 8:
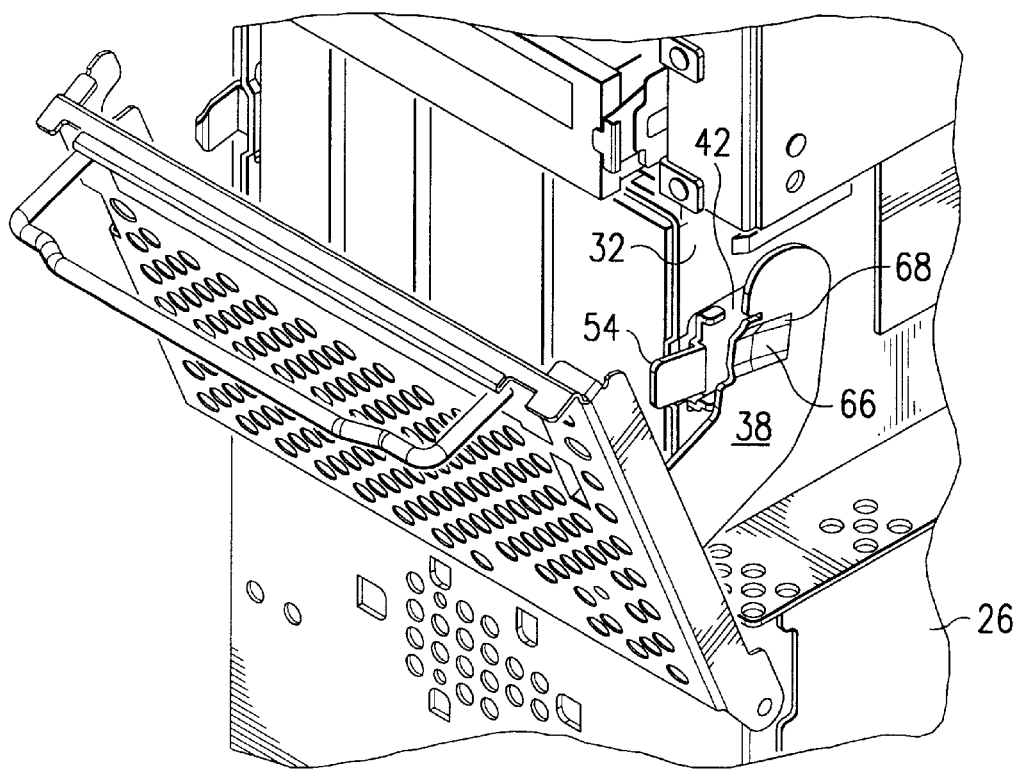
FIG. 8 is a partial isometric view illustrating an embodiment of a hard drive bracket mounted in a computer chassis.

Each arm 38, FIG. 7, includes an inside surface 58, an outside surface 60, a first end 62 connected to door 36 and a second terminal end 64. A detent 66 includes a tapered end 68 and a shoulder end 70. When bracket 32 is seated in chassis 26, as shown in FIG. 4, door 36 is pivoted from the open position designated O, toward a closed position. Arms 38 slidably engage flared lip portion 54, FIG. 8, of each tab 42, due to the tapered end 68 of detent 66, which urges tabs 42 toward bracket 32. This permits arms 38 to nest between bracket 32 and chassis 26, a portion of chassis 26 being removed in FIG. 8, for purposes of illustration. Further movement of door 36 toward the closed position designated C, FIG. 9, permits flared lip portions 54 of each tab 42 to engage a respective one of the tab securing slots 40, and more specifically, permits an edge portion 72 of slots 40 to force locking tabs 42 outwardly into the engaged position designated E, whereby tabs 50, FIGS. 5 and 6, are secured into engagement with their respective apertures 56 in chassis 26.

Figure 9:
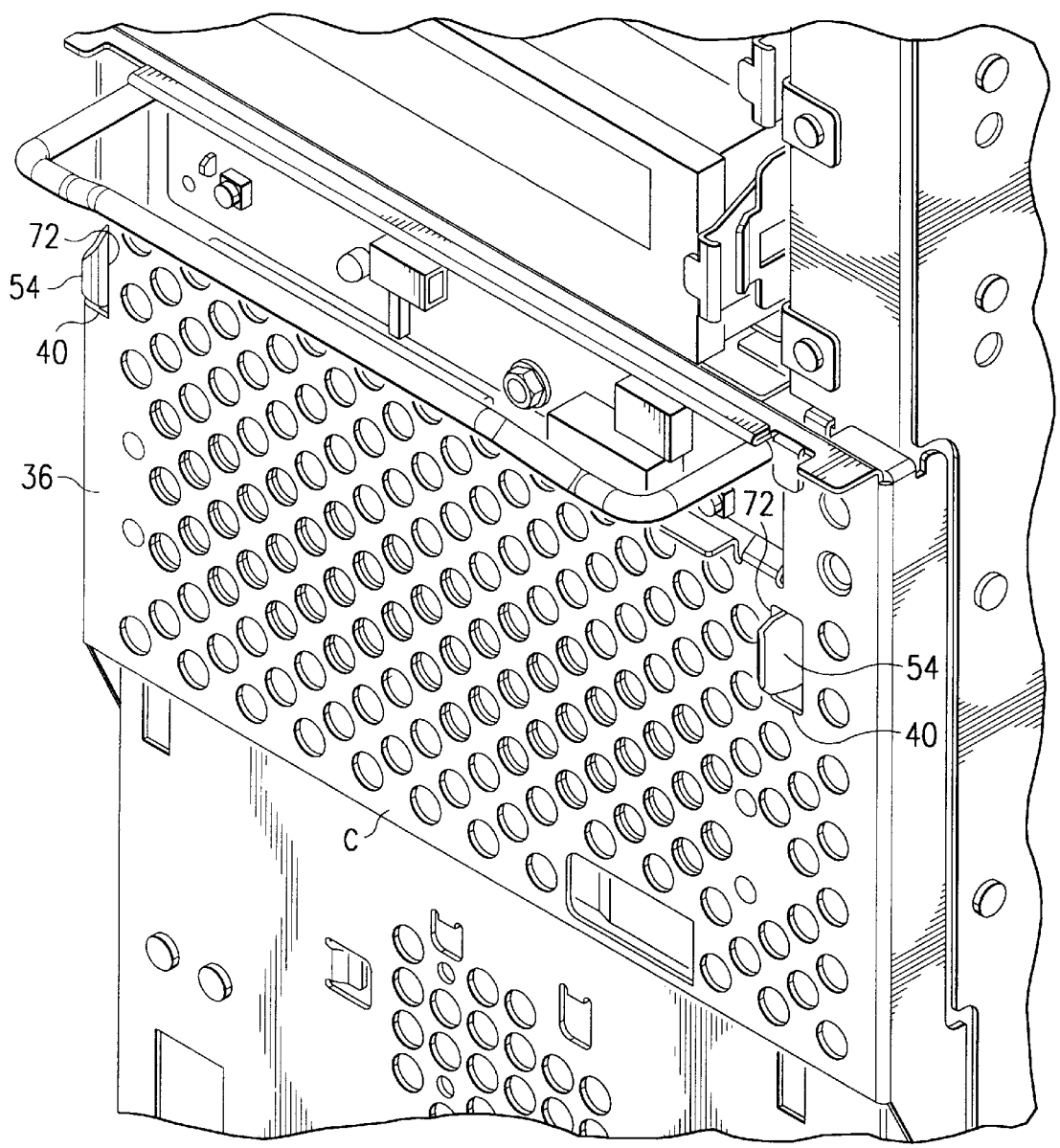
FIG. 9 is a partial isometric view illustrating an embodiment of a computer chassis door securing a hard drive bracket in a computer chassis.
Figure 10:
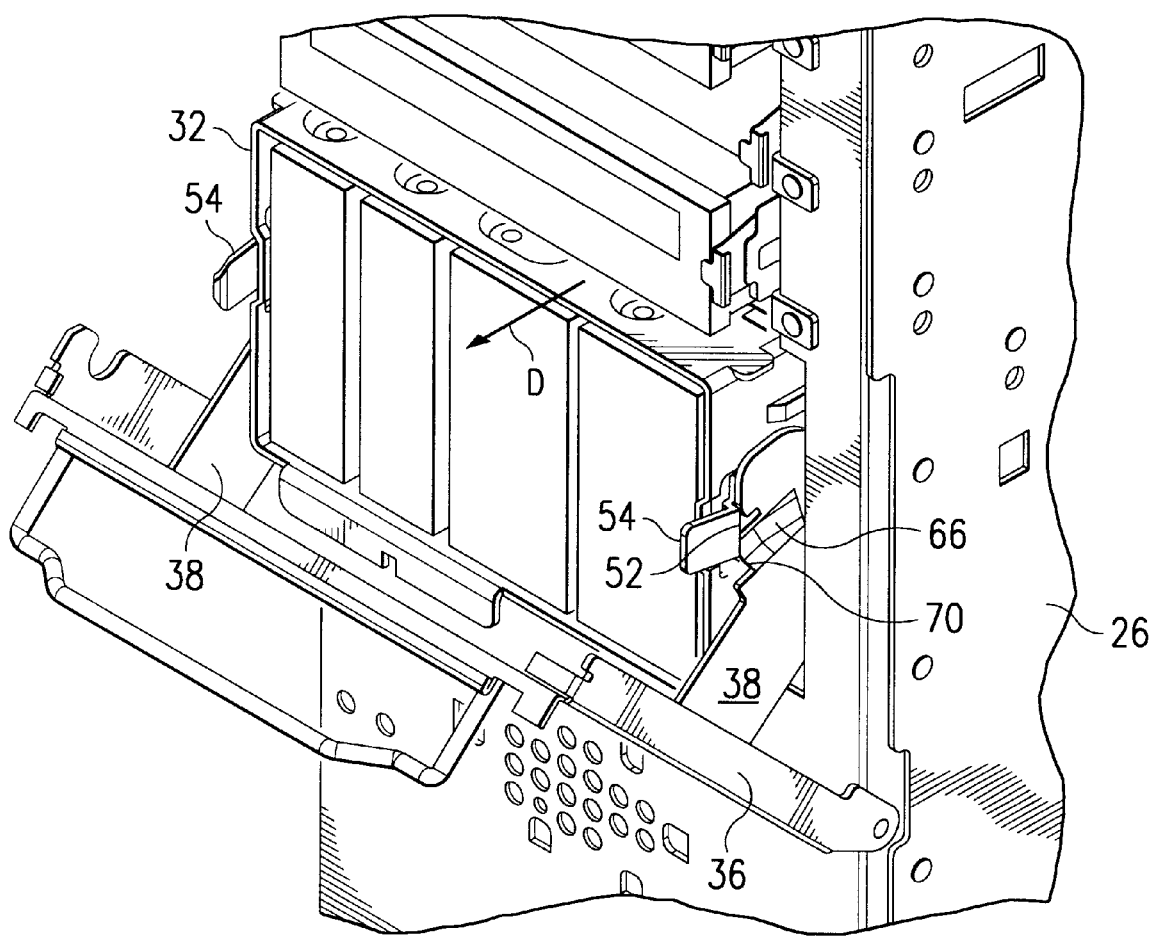
FIG. 10 is a partial isometric view illustrating an embodiment of a hard drive bracket being ejected from a computer chassis.
Figure 11:
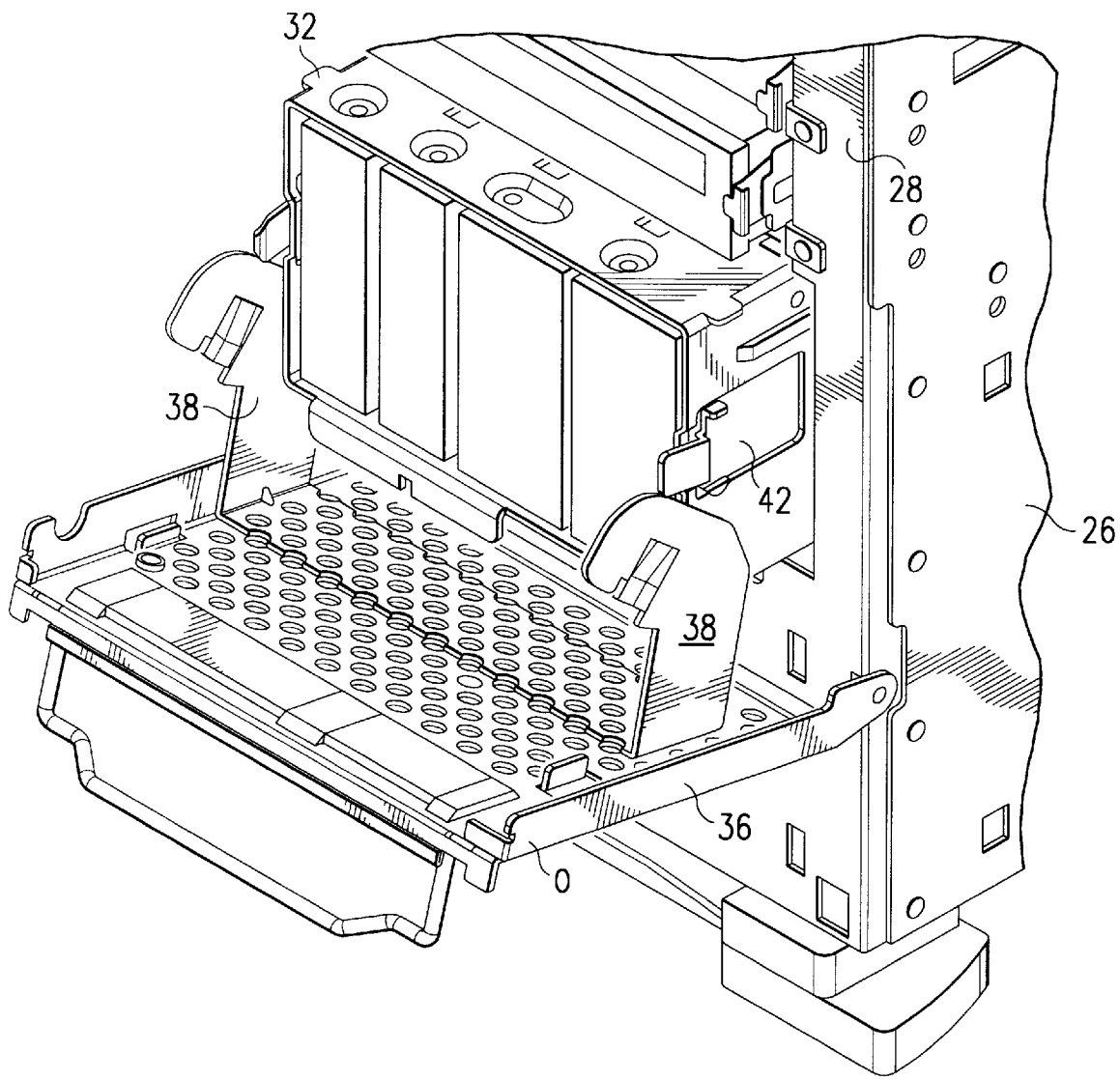
FIG. 11 is a partial isometric view illustrating an embodiment of a hard drive bracket partially ejected from a computer chassis.

When it is desired to remove bracket 32 from chassis 26, door 36 is moved from the closed position designated C, FIG. 9, toward the open position designated O, FIG. 2, which disengages lip portions 54 from slots 40, FIG. 9. Movement of arms 38, FIG. 9, urges detents 66 into engagement with tabs 42 sufficient to dislodge tabs 50 from their respective apertures 56, see FIGS. 5 and 6. In addition, shoulders 70, FIG. 10, of arms 38 engage shoulders 52 of tabs 42 and urge bracket 32 outwardly from chassis 26 in a direction indicated by the directional arrow designated D. Further movement of door 36 to the open position designated O, FIG. 11, dislodges arms 38 from tabs 42 so that bracket 32 rests in a partially ejected position for easy manual removal from chassis 26.

As it can be seen, the principal advantages of these embodiments are that the bracket and the hard drives are accessible at the front panel of the mini-tower chassis. The bracket is removable by a door device that secures the bracket in position within the chassis and that partially ejects the bracket for removal. This improvement requires less space for its implementation and therefore more chassis space is made available for other components. The bracket and door combination provides screwless mounting and removal of the hard drives, and the door secures the bracket in the installed position within the chassis.

As a result, one embodiment provides a bracket support including chassis having a bracket movably mounted therein. A locking tab is mounted on the bracket, such that the locking tab is movable between an engaged position with the chassis and a released position with the chassis. A door is mounted on a surface of the chassis. The door is movable between an open position and a closed position and has a tab securing slot formed therein. An arm extends from the movable door. The arm moves with the door to move the locking tab to the engaged position when the door is in the closed position, and moves the locking tab to the released position when the door is moved toward the open position. Movement of the door toward the open position also partially extracts the bracket from the chassis.

Another embodiment provides a computer system including a chassis, a microprocessor mounted in the chassis, an input coupled to provide input to the microprocessor, a mass storage coupled to the microprocessor, a display coupled to the microprocessor by a video controller, and a memory coupled to provide storage to facilitate execution of computer programs by the microprocessor in the chassis. A bracket is movably mounted in the chassis and a locking tab is mounted on the bracket and is movable between an engaged position with the chassis and a released position with the chassis. A door is mounted on a surface of the chassis, and is movable between an open position and a closed position. The door has a tab securing slot formed thereon. An arm extends from the movable door. The arm is movable with the door to move the locking tab to the engaged position when the door is in the closed position, and to move the locking tab to the released position when the door is moved toward the open position.

A further embodiment provides a method of supporting and securing a bracket in a computer chassis by slidably mounting a bracket in the computer chassis. A locking tab extends from the bracket so as to be movable between an engaged position with the chassis and a released position with the chassis. A door is mounted on a surface of the chassis adjacent the bracket, and is movable between an open position and a closed position. The door includes a tab securing slot formed therein. An arm is extended from the movable door for movement with the door. Moving the door to the closed position, moves the locking tab to the engaged position, and moving the door toward the open position, moves the locking tab to the released position.

A still further embodiment provides a chassis and a bracket movably mounted therein. First means are mounted on the bracket for movement between an engaged position with the chassis and a released position with the chassis. A door is mounted on a surface of the chassis. The door is movable between an open position and a closed position, and has a tab securing slot formed therein. Second means extend from the movable door and are movable with the door for moving the first means to the engaged position when the door is in the closed position, and movable with the door for moving the first means to the released position when the door is moved toward the open position.

Although illustrative embodiments have been shown and described, a wide range of modifications, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A bracket support comprising:
   a chassis;
   a bracket movably mounted in the chassis;
   a locking tab mounted on the bracket, the locking tab being movable between an engaged position with the chassis and a released position with the chassis;
   a door mounted on a surface of the chassis, the door being movable between an open position and a closed position, and having a tab securing slot therein for moving the locking tab to the engaged position when the door is in the closed position; and
   an arm extending from the movable door, the arm being movable with the door to move the locking tab to the released position when the door is moved toward the open position.

2. The bracket support as defined in claim 1 wherein an edge surface of the tab securing slot secures the locking tab into the engaged position when the door is in the closed position.

3. The bracket support as defined in claim 1 wherein the arm includes a detent for urging the locking tab into the released position when the door is moved toward the open position.

4. The bracket support as defined in claim 1 wherein the arm includes a shoulder for moving the bracket relative to the chassis when the door is moved toward the open position.

5. The bracket support as defined in claim 1 wherein the bracket contains a plurality of hard drives.

6. A bracket support comprising:
   a chassis;
   a bracket movably mounted in the chassis;
   a locking tab mounted on the bracket, the locking tab being movable between an engaged position with the chassis and a released position with the chassis;
   a door mounted on a surface of the chassis, the door being movable between an open position and a closed position, and having a tab securing slot therein for moving the locking tab to the engaged position when the door is in the closed position; and
   an arm extending from the movable door, the arm being movable with the door to move the locking tab to the released position and to partially extract the bracket from the chassis, when the door is moved toward the open position.

7. The bracket support as defined in claim 6 wherein an edge surface of the tab securing slot secures the locking tab into the engaged position when the door is in the closed position.

8. The bracket support as defined in claim 6 wherein the arm includes a detent for urging the locking tab into the released position when the door is moved toward the open position.

9. The bracket support as defined in claim 6 wherein the arm includes a shoulder for partially extracting the bracket from the chassis.

10. The bracket support as defined in claim 6 wherein the bracket contains a plurality of hard drives.

11. A computer system comprising:
    a chassis;
    a microprocessor mounted in the chassis;
    an input coupled to provide input to the microprocessor;
    a mass storage coupled to the microprocessor in the chassis;
    a display coupled to the microprocessor by a video controller;
    a memory coupled to provide storage to facilitate execution of computer programs by the microprocessor in the chassis;
    a bracket movably mounted in the chassis;
    a locking tab mounted on the bracket, the locking tab being movable between an engaged position with the chassis and a released position with the chassis;
    a door mounted on a surface of the chassis, the door being movable between an open position and a closed position, and having a tab securing slot therein for moving the locking tab to the engaged position when the door is in the closed position; and
    an arm extending from the movable door, the arm being movable with the door to move the locking tab to the released position when the door is moved toward the open position.

12. The bracket support as defined in claim 11 wherein an edge surface of the tab securing slot secures the locking tab into the engaged position when the door is in the closed position.

13. The bracket support as defined in claim 11 wherein the arm includes a detent for urging the locking tab into the released position when the door is moved toward the open position.

14. The bracket support as defined in claim 11 wherein the arm includes a shoulder for moving the bracket relative to the chassis when the door is moved toward the open position.

15. The bracket support as defined in claim 11 wherein the bracket contains a plurality of hard drives.

16. A method of movably supporting and securing a bracket in a computer chassis comprising the steps of:
    slidably mounting a bracket in a computer chassis;
    extending a locking tab from the bracket, the locking tab being movable between an engaged position with the chassis and a released position with the chassis;
    mounting a door on a surface of the chassis adjacent the bracket, the door being movable between an open position and a closed position, and having a tab securing slot therein;
    extending an arm from the movable door for movement with the door;
    moving the door to the closed position to move the locking tab to the engaged position; and
    moving the door toward the open position to move the locking tab to the released position.

17. The method as defined in claim 16, wherein the step of moving the door to the closed position includes the step of engaging the locking tab with an edge surface of the tab securing slot.

18. The method as defined in claim 16 wherein the step of moving the door toward the open position includes the step of urging the locking tab into the released position by engagement of a detent on the arm.

19. The method as defined in claim 16 wherein the step of moving the door toward the open position includes the step of partially extracting the bracket from the chassis.

20. The method as defined in claim 19 wherein the step of partially extracting the bracket from the chassis includes the step of engaging the locking tab with a shoulder formed on the arm.

21. A bracket supported comprising:

a chassis;

a bracket movably mounted in the chassis;

first means mounted on the bracket for movement between an engaged position with the chassis and a released position with the chassis;

a door mounted on a surface of the chassis, the door being movable between an open position and a closed position, and having a tab securing slot therein; and second means extending from the movable door, the door urging the first means to the engaged position when the door is in the closed position, the second means movable with the door for moving the first means to the released position when the door is moved to the open position.

* * * * *